(12) United States Patent  
Ide

(10) Patent No.: US 12,471,210 B2  
(45) Date of Patent: Nov. 11, 2025

(54) SENSOR UNIT AND IMAGE FORMING APPARATUS INCLUDING SENSOR UNIT

(71) Applicant: CANON KABUSHIKI KAISHA, Tokyo (JP)

(72) Inventor: Takumi Ide, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 285 days.

(21) Appl. No.: 18/331,759

(22) Filed: Jun. 8, 2023

(65) Prior Publication Data

US 2023/0403788 A1  Dec. 14, 2023

(30) Foreign Application Priority Data

Jun. 13, 2022 (JP) .................................. 2022-094839

(51) Int. Cl.
  *H05K 1/02* (2006.01)
  *B65H 5/06* (2006.01)
  (Continued)

(52) U.S. Cl.
  CPC ........... *H05K 1/0274* (2013.01); *B65H 5/062* (2013.01); *H05K 1/0287* (2013.01); *H05K 1/181* (2013.01); *H05K 3/305* (2013.01); *B65H 2402/45* (2013.01); *B65H 2553/46* (2013.01); *B65H 2801/15* (2013.01);
  (Continued)

(58) Field of Classification Search
  CPC ...... H05K 1/02; H05K 1/0287; H05K 1/0274; H05K 1/18; H05K 1/181–187; H05K 3/305; H05K 2201/101451; H05K 2201/09072; H05K 2201/09063;
  (Continued)

(56) References Cited

U.S. PATENT DOCUMENTS

2014/0232054 A1* 8/2014 Ota ..................... B65H 5/062
  271/265.01
2019/0327376 A1* 10/2019 Miyakoshi ......... H04N 1/00748
  (Continued)

FOREIGN PATENT DOCUMENTS

JP  H08242018 A  9/1996
JP  2007059658 A  3/2007
(Continued)

*Primary Examiner* — Tuan T Dinh
(74) *Attorney, Agent, or Firm* — Canon U.S.A., Inc. I.P. Division

(57) ABSTRACT

A sensor unit includes a light-emitting unit including a light-emitting element configured to emit light, a light-receiving unit including a light-receiving element configured to receive the light emitted from the light-emitting element, a flag configured to pass through a space between the light-emitting unit and the light-receiving unit, and a board, wherein a cutout or a hole is formed in the board, wherein the light-emitting unit and the light-receiving unit are mounted on the mounting surface of the board so that the light-emitting element and the light-receiving element face each other, and the light emitted from the light-emitting element travels straight along the mounting surface of the board over the cutout or the hole, and wherein the flag moves in a direction intersecting the mounting surface of the board and enters the cutout or the hole, thereby blocking the light traveling from the light-emitting element to the light-receiving element.

8 Claims, 16 Drawing Sheets

(51) Int. Cl.
  *H05K 1/18* (2006.01)
  *H05K 3/30* (2006.01)
(52) U.S. Cl.
  CPC .............. *H05K 2201/09072* (2013.01); *H05K 2201/10121* (2013.01); *H05K 2201/10151* (2013.01); *H05K 2201/10522* (2013.01)
(58) Field of Classification Search
  CPC .......... H05K 2201/10121; H05K 2201/10522; B65H 5/062; B65H 7/14
  USPC ................. 361/782–784, 790–795, 816, 818
  See application file for complete search history.

(56) References Cited

U.S. PATENT DOCUMENTS

| | | | | |
|---|---|---|---|---|
| 2020/0220264 A1* | 7/2020 | Montgomery | ........... | H01Q 5/48 |
| 2021/0262942 A1* | 8/2021 | Davis | ...................... | G01N 21/31 |
| 2022/0058355 A1* | 2/2022 | Yoshida | .................. | G06F 21/36 |

FOREIGN PATENT DOCUMENTS

| | | |
|---|---|---|
| JP | 2007109851 A | 4/2007 |
| JP | 2008000165 A | 1/2008 |
| JP | 2008159942 A | 7/2008 |

\* cited by examiner

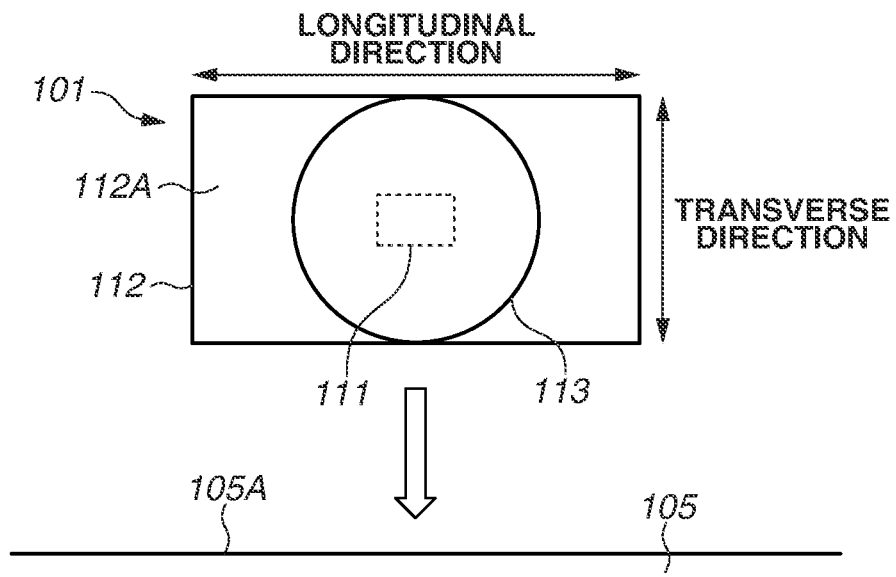
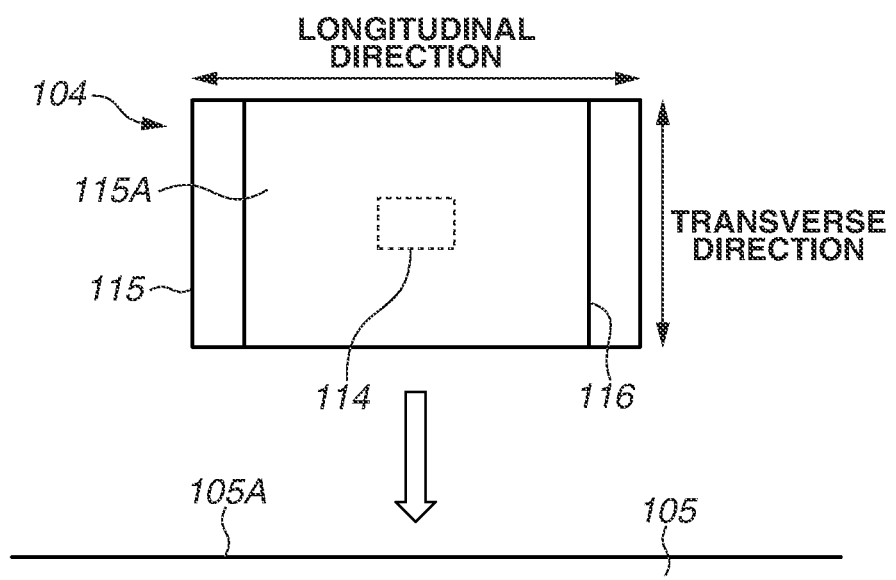

SENSOR UNIT AND IMAGE FORMING APPARATUS INCLUDING SENSOR UNIT

BACKGROUND

Field of the Disclosure

The present disclosure relates to a sensor unit that detects a flag using a light-emitting element and a light-receiving element.

Description of the Related Art

A photointerrupter as a sensor unit is known that includes a light-emitting element, such as a light-emitting diode (LED), and a light-receiving element, such as a phototransistor, and detects a flag by making use of the fact that the flag blocks light when the flag passes between the light-emitting element and the light-receiving element.

Japanese Patent Application Laid-Open No. 8-242018 and Japanese Patent Application Laid-Open No. 2008-159942 discuss a photointerrupter including a light-emitting element that emits light and a light-receiving element attached to the same surface of a printed circuit board as the light-emitting element to receive light from the light-emitting element. The light from the light-emitting element is emitted in a direction parallel to the surface of the printed circuit board. Further, in Japanese Patent Application Laid-Open No. 8-242018 and Japanese Patent Application Laid-Open No. 2008-159942, a cutout into which a detection object (a flag) is inserted is formed in the printed circuit board between the light-emitting element and the light-receiving element.

Japanese Patent Application Laid-Open No. 8-242018 and Japanese Patent Application Laid-Open No. 2008-159942, however, do not discuss the direction in which the detection object enters the cutout of the printed circuit board formed between the light-emitting element and the light-receiving element. Further, Japanese Patent Application Laid-Open No. 8-242018 and Japanese Patent Application Laid-Open No. 2008-159942 do not discuss the relationship between the entry direction of the detection object to the cutout of the printed circuit board and the responsiveness of a sensor unit at all.

SUMMARY

The present disclosure is directed to providing a sensor unit excellent in responsiveness.

According to an aspect of the present disclosure, a sensor unit includes a light-emitting unit including a light-emitting element configured to emit light, a light-receiving unit including a light-receiving element configured to receive the light emitted from the light-emitting element, a flag configured to pass through a space between the light-emitting unit and the light-receiving unit, and a printed circuit board having a mounting surface on which the light-emitting unit and the light-receiving unit are mounted, wherein a cutout or a hole is formed in the printed circuit board, wherein, on the mounting surface of the printed circuit board, a pattern of a portion where at least the light-emitting unit is mounted is a solid pattern, wherein the light-emitting unit and the light-receiving unit are mounted on the mounting surface of the printed circuit board so that the light-emitting element and the light-receiving element face each other, and the light emitted from the light-emitting element travels straight along the mounting surface of the printed circuit board over the cutout or the hole, and wherein the flag is configured to move in a direction intersecting the mounting surface of the printed circuit board and enter the cutout or the hole, thereby blocking the light traveling from the light-emitting element to the light-receiving element.

According to another aspect of the present disclosure, an image forming apparatus includes an image forming unit configured to form an image on a recording material, and a sensor unit, wherein the sensor unit includes a light-emitting unit including a light-emitting element configured to emit light, a light-receiving unit including a light-receiving element configured to receive the light emitted from the light-emitting element, a flag configured to pass through a space between the light-emitting unit and the light-receiving unit, and a printed circuit board having a mounting surface on which the light-emitting unit and the light-receiving unit are mounted, wherein a cutout or a hole is formed in the printed circuit board, wherein the light-emitting unit and the light-receiving unit are mounted on the mounting surface of the printed circuit board so that the light-emitting element and the light-receiving element face each other, and the light emitted from the light-emitting element travels straight along the mounting surface of the printed circuit board over the cutout or the hole, and wherein the flag is configured to move in a direction intersecting the mounting surface of the printed circuit board and enter the cutout or the hole, thereby blocking the light traveling from the light-emitting element to the light-receiving element.

Further features of various embodiments of the present disclosure will become apparent from the following description of exemplary embodiments with reference to the attached drawings.

BRIEF DESCRIPTION OF THE DRAWINGS

FIG. 2A is a diagram illustrating details of a light-emitting unit of an optical sensor according to the first exemplary embodiment, and FIG. 2B is a diagram illustrating details of a light-receiving unit of the optical sensor according to the first exemplary embodiment.

DESCRIPTION OF THE EMBODIMENTS

With reference to the drawings, suitable exemplary embodiments of the present disclosure will be described in detail in an illustrative manner below. However, the dimensions, the materials, the shapes, and the relative arrangement of components described in the following exemplary embodiments should be appropriately changed depending on the configuration of an apparatus to which the present disclosure is applied, or various conditions. The scope of the present disclosure is not limited to them only.
<Description of Configuration of Sensor>

Figure 1:
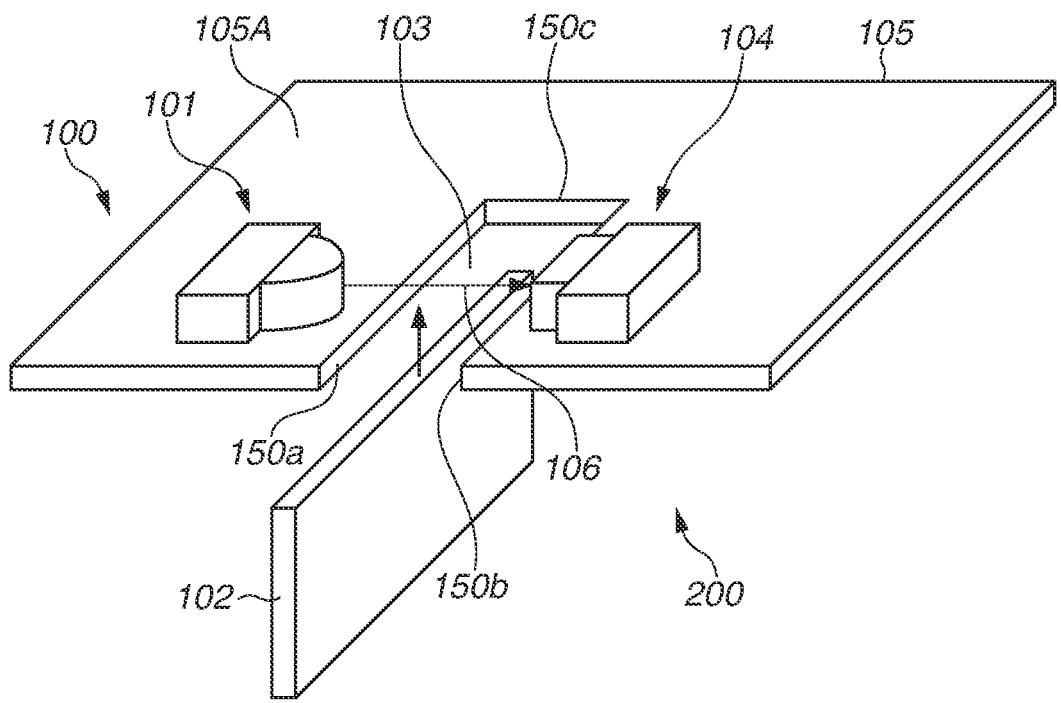
FIG. 1 is a perspective view of a sensor unit according to a first exemplary embodiment.

With reference to FIG. 1, a sensor unit according to a first exemplary embodiment of the present disclosure is described. FIG. 1 is a perspective view of the sensor unit according to the first exemplary embodiment.

A sensor unit 200 according to the first exemplary embodiment includes an optical sensor 100 and a flag 102. The optical sensor 100 includes a light-emitting unit 101 that emits light, and a light-receiving unit 104 that receives the light from the light-emitting unit 101. The light emitted from the light-emitting unit 101 passes through a space 103 and reaches the light-receiving unit 104. The flag 102 can block the light from the light-emitting unit 101 in the space 103, whereby the amount of light received by the light-receiving unit 104 changes, and the optical sensor 100 detects the flag 102. As illustrated in FIG. 1, a printed circuit board 105 includes a mounting surface 105A on which the light-emitting unit 101 and the light-receiving unit 104 are mounted.

The light-emitting unit 101 is a surface mount type light-emitting diode (LED). As the light-emitting unit 101, a side view type LED that emits light traveling straight along the mounting surface 105A of the printed circuit board 105 is used. The light-receiving unit 104 is a surface mount type phototransistor. As the light-receiving unit 104, a side view type phototransistor that receives light having traveled straight along the mounting surface 105A of the printed circuit board 105 is used. As illustrated in FIG. 1, an optical path 106 of the light emitted from the light-emitting unit 101 to the light-receiving unit 104 is straight in a direction substantially parallel to the mounting surface 105A of the printed circuit board 105.

As illustrated in FIG. 1, in the printed circuit board 105, a cutout 150 is provided between the light-emitting unit 101 and the light-receiving unit 104. The cutout 150 is an entry path for the flag 102. The flag 102 moves through the cutout 150, thereby blocking the light emitted from the light-emitting unit 101. Consequently, the amount of light received by the light-receiving unit 104 changes, and the flag 102 is detected.

With reference to FIG. 2A, the side view type light-emitting unit 101 is described.

The light-emitting unit 101 has a configuration in which an LED chip 111 as a light-emitting element is mounted on a surface 112A of an LED substrate 112 and covered by a lens 113. FIG. 2A is a view of the light-emitting unit 101 when viewed in a direction perpendicular to the surface 112A of the LED substrate 112. As illustrated in FIG. 2A, the surface 112A of the LED substrate 112 and the mounting surface 105A of the printed circuit board 105 on which the light-emitting unit 101 is mounted have a substantially perpendicular relationship. The direction of an arrow indicates the direction in which the light-emitting unit 101 is mounted on the printed circuit board 105.

Light emitted from the LED chip 111 passes through the lens 113, thereby spreading with predetermined directionality in each of the longitudinal direction and the transverse direction of the light-emitting unit 101. The directionality of the light-emitting unit 101 will be described in detail below.

FIG. 2B is a diagram illustrating the side view type light-receiving unit 104. The light-receiving unit 104 has a configuration in which a phototransistor chip 114 as a light-receiving element is mounted on a surface 115A of a phototransistor substrate 115 and covered by a lens 116. FIG. 2B is a view of the light-receiving unit 104 when viewed in a direction perpendicular to the surface 115A of the phototransistor substrate 115. As illustrated in FIG. 2B, the surface 115A of the phototransistor substrate 115 and the mounting surface 105A of the printed circuit board 105 on which the light-receiving unit 104 is mounted have a substantially perpendicular relationship. The direction of an arrow indicates the direction in which the light-receiving unit 104 is mounted on the printed circuit board 105.

The light-emitting unit 101 and the light-receiving unit 104 are mounted on the same surface (the mounting surface 105A) of the printed circuit board 105 and placed so that the LED chip 111 and the phototransistor chip 114 face each other. Consequently, compared to a configuration employing a top view type LED and a top view type phototransistor, a light guide having a reflective surface inside or a housing is not required, and the light-receiving unit 104 can directly receive the light emitted from the light-emitting unit 101. More specifically, the light-receiving unit 104 can directly receive the light emitted in a direction substantially parallel to the mounting surface 105A of the printed circuit board 105 from the light-emitting unit 101.

<Description of Circuit Diagram>

Figure 3:
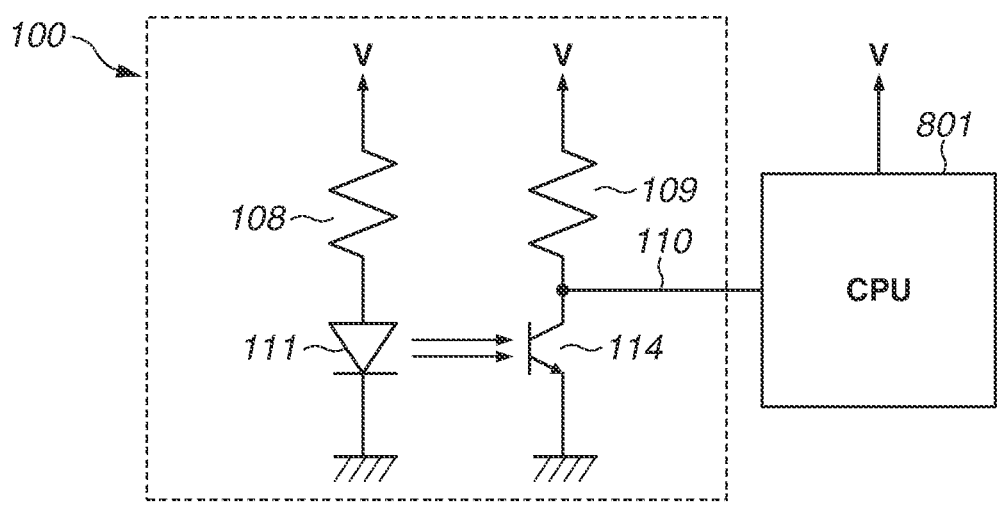
FIG. 3 is a circuit diagram of the optical sensor according to the first exemplary embodiment.

FIG. 3 is a circuit diagram of the optical sensor 100 according to the present exemplary embodiment. FIG. 3 also illustrates a central processing unit (CPU) 801 connected to the optical sensor 100. The CPU 801 may be included in the sensor unit 200, or may be included in an image forming apparatus 900 to be described below.

The anode of the LED chip 111 of the light-emitting unit 101 is connected to a direct current (DC) power supply via a current-limiting resistor 108, and the cathode of the LED chip 111 is connected to the ground (GND). The collector of the phototransistor chip 114 of the light-receiving unit 104 is connected to the DC power supply via a pull-up resistor 109, and the emitter of the phototransistor chip 114 is connected to the GND. A voltage output unit 110 is connected to the collector of the phototransistor chip 114 and indicates a voltage between a collector terminal of the phototransistor chip 114 and the GND. In a state where the phototransistor chip 114 is on, i.e., in a state where light is incident on the phototransistor chip 114, the voltage output unit 110 provides a low output (a GND voltage). On the other hand, in a state where the phototransistor chip 114 is off, i.e., in a state where light is not incident on the phototransistor chip 114, the voltage output unit 110 provides a high output (the voltage of the DC power supply). In the present configuration, the voltage of the DC power supply is 3.3 V.

The CPU 801 sets thresholds in advance for the output voltage of the voltage output unit 110. If the output voltage is higher than a threshold set to 80% of 3.3 V, the CPU 801 determines that the flag 102 is present between the light-emitting unit 101 and the light-receiving unit 104. If the output voltage is lower than a threshold set to 20% of 3.3 V, the CPU 801 determines that the flag 102 is not present between the light-emitting unit 101 and the light-receiving unit 104. The thresholds for the output voltage can be freely set in advance.

<Description of Stray Light>

Figure 4:
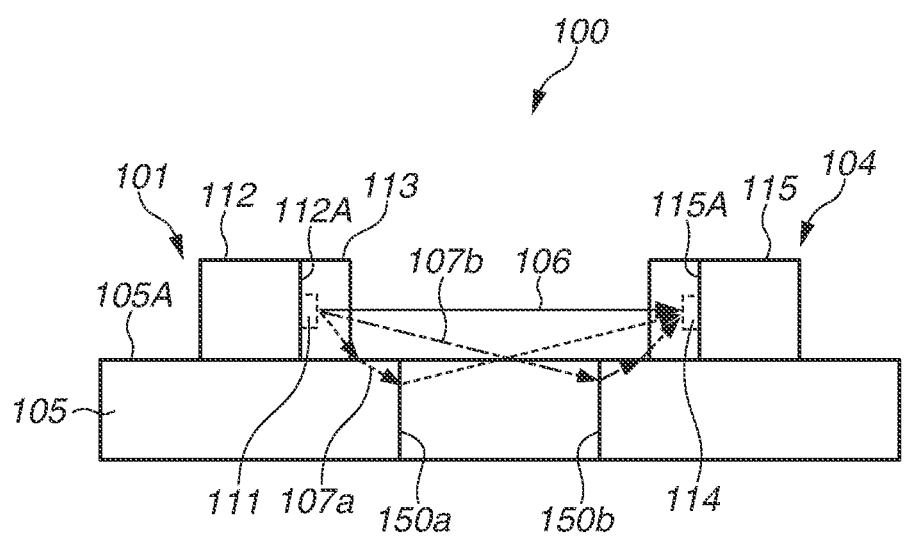
FIG. 4 is a cross-sectional view of the optical sensor according to the first exemplary embodiment.
Figure 5:
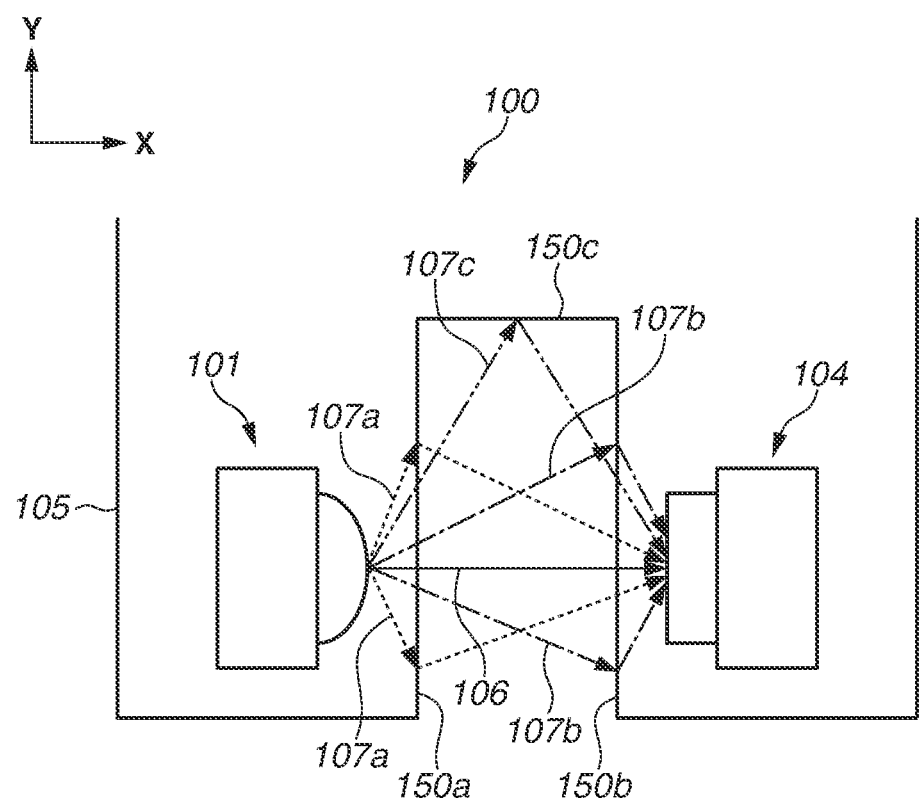
FIG. 5 is a top view of the optical sensor according to the first exemplary embodiment.

With reference to FIGS. 4 and 5, propagation of stray light according to the present exemplary embodiment is described. The stray light refers to light reaching the light-receiving unit 104 through an optical path other than the optical path 106 through which light is emitted parallel to the surface of the printed circuit board 105 from the light-emitting unit 101 and reaches the light-receiving unit 104.

FIG. 4 illustrates a side view of the optical sensor 100. A solid line arrow indicates the optical path 106 through which light emitted parallel to the surface of the printed circuit board 105 from the LED chip 111 reaches the phototransistor chip 114. Dashed line arrows and one-dot chain line arrows indicate optical paths of stray light entering and propagating inside the printed circuit board 105.

As stray light 107a indicated by the dashed line arrows, light emitted from the LED chip 111 enters inside the printed circuit board 105 from the mounting surface 105A on the light-emitting unit 101 side. Then, the light exits from a side surface 150a of the cutout 150 on the light-emitting unit 101 side to space again and reaches the phototransistor chip 114. As stray light 107b indicated by the one-dot chain line arrows, light emitted from the LED chip 111 enters inside the printed circuit board 105 from a side surface 150b of the cutout 150 on the light-receiving unit 104 side, exits from the mounting surface 105A on the light-receiving unit 104 side, and reaches the phototransistor chip 114.

FIG. 5 illustrates a top view of the optical sensor 100. As illustrated in FIG. 5, it is understood that each of the stray light 107a and the stray light 107b has a predetermined width in a Y-direction.

The Y-direction corresponds to the longitudinal direction of the light-emitting unit 101 described with reference to FIG. 2A and is a direction parallel to the surface of the printed circuit board 105. An X-direction is a direction parallel to the optical path 106 and parallel to the surface of the printed circuit board 105. While not illustrated in FIG. 5, a Z-direction corresponds to the transverse direction of the light-emitting unit 101 described with reference to FIG. 2A and is a direction perpendicular to the surface of the printed circuit board 105. The X-direction, the Y-direction, and the Z-direction are orthogonal to each other.

Two-dot chain line arrows indicate stray light 107c that is light emitted from the LED chip 111, reflected by a back-side side surface 150c of the U-shaped cutout 150 of the printed circuit board 105, and that reaches the phototransistor chip 114.

As illustrated in FIGS. 4 and 5, light traveling from the light-emitting unit 101 to the light-receiving unit 104 is not only the light traveling through the optical path 106 through which the light emitted parallel to the surface of the printed circuit board 105 from the LED chip 111 reaches the phototransistor chip 114. The stray light 107a and the stray light 107b propagating via the inside of the printed circuit board 105 and the stray light 107c propagating by being reflected by the side surface 150c of the cutout 150 exist.

<Description of Relationship Between Entry Direction of Flag and Responsiveness of Optical Sensor>

With reference to FIGS. 6A to 13, a relationship between the entry direction and the entry amount of the flag 102 and the responsiveness of the optical sensor 100 according to the present exemplary embodiment is described.

(Case where Flag is Caused to Enter Printed Circuit Board from Side Surface Side of Printed Circuit Board)

Figure 6A:
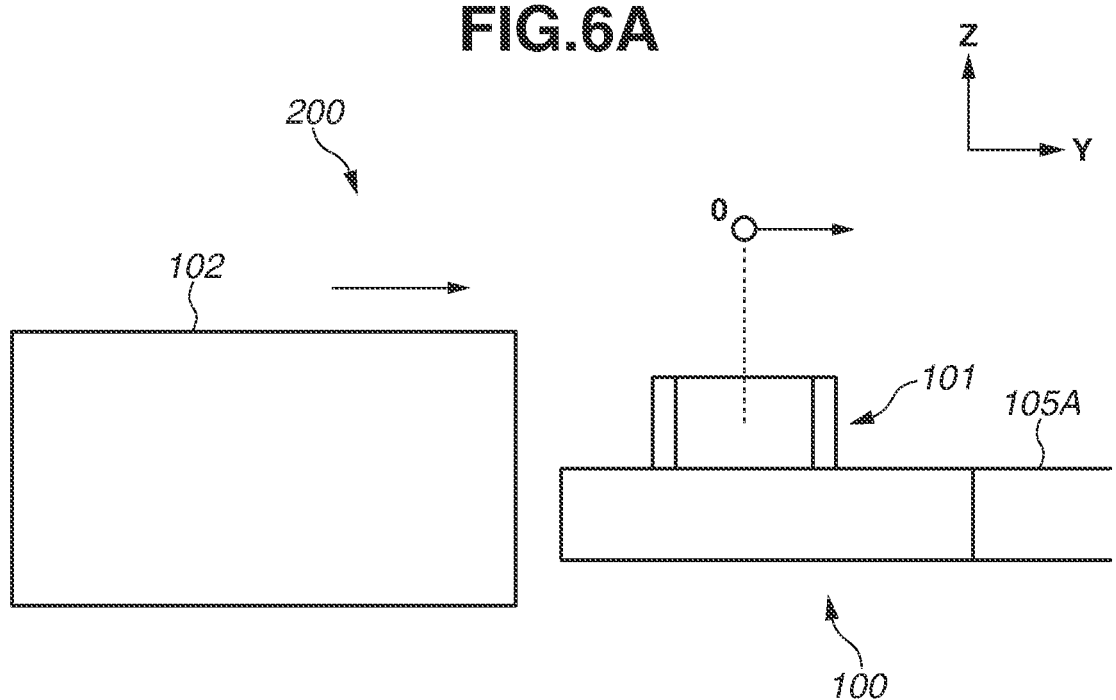
FIG. 6A is a cross-sectional view in a case where a flag according to the first exemplary embodiment enters a printed circuit board from a side surface side of the printed circuit board.

First, a case is described where the flag 102 enters the printed circuit board 105 from a side surface of the printed circuit board 105. FIG. 6A illustrates the state. FIG. 6A is a cross-sectional view of the sensor unit 200 when viewed along the optical axis of the light emitted from the light-emitting unit 101. FIG. 6A selectively illustrates a part of the sensor unit 200. The flag 102 moves in the Y-direction parallel to the mounting surface 105A of the printed circuit board 105 and enters the printed circuit board 105 from an opening side of the cutout 150 of the printed circuit board 105. A coordinate 0 in the Y-direction in FIG. 6A corresponds to the center position of the optical axis of the optical path 106 in FIG. 4.

Figure 7A:
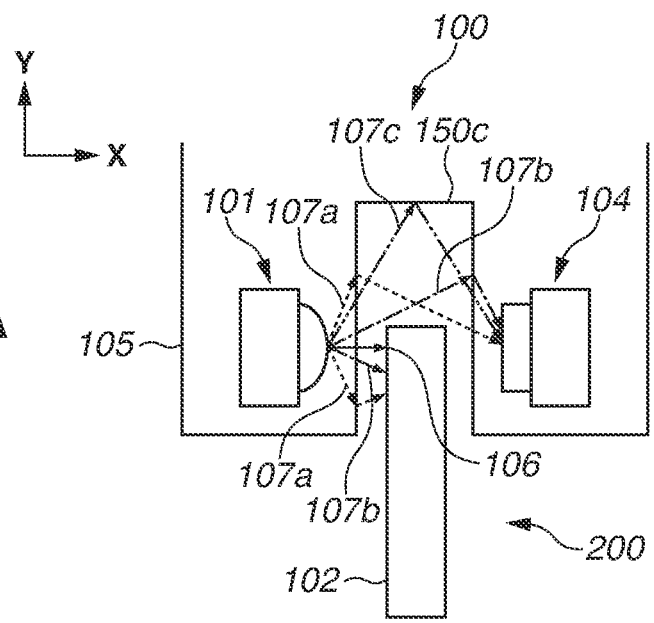
FIGS. 7A, 7B, and 7C are top views in the case where the flag according to the first exemplary embodiment enters the printed circuit board from the side surface side of the printed circuit board.
Figure 7B:
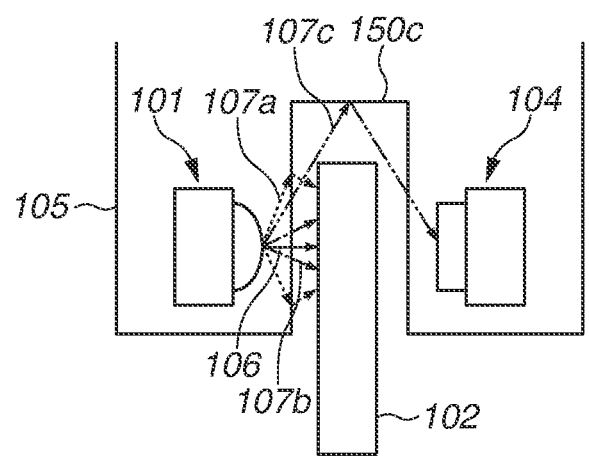
Figure 7C:
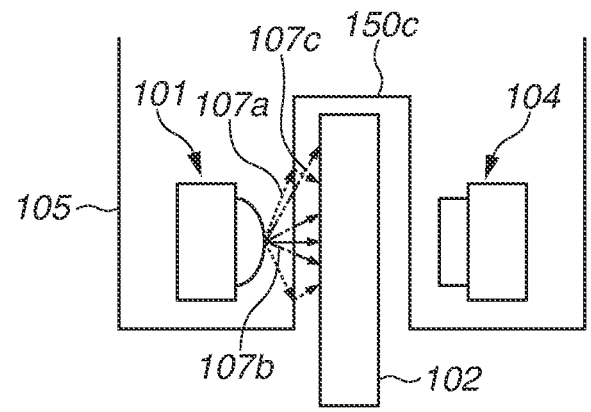

FIGS. 7A to 7C are top views of the sensor unit 200 and illustrate the state where the flag 102 enters the cutout 150 from the side surface of the printed circuit board 105. In a case where the flag 102 enters the cutout 150 from the side surface side of printed circuit board 105, the flag 102 moves from the negative side to the positive side of the Y-direction. In this configuration, as illustrated in FIG. 7A, even if the flag 102 blocks the optical path 106, parts of the stray light 107a, the stray light 107b, and the stray light 107c remain. In other words, in the state of FIG. 7A, the light-receiving unit 104 receives the stray light 107a, the stray light 107b, and the stray light 107c, and the flag 102 cannot completely block light incident on the light-receiving unit 104. Even if the flag 102 is caused to enter the cutout 150 more deeply from the state of FIG. 7A and moved to the position of the flag 102 in FIG. 7B, the light-receiving unit 104 still receives the stray light 107c. If the flag 102 is further moved to the position thereof in FIG. 7C, the flag 102 blocks the stray light 107c.

Figure 6B:
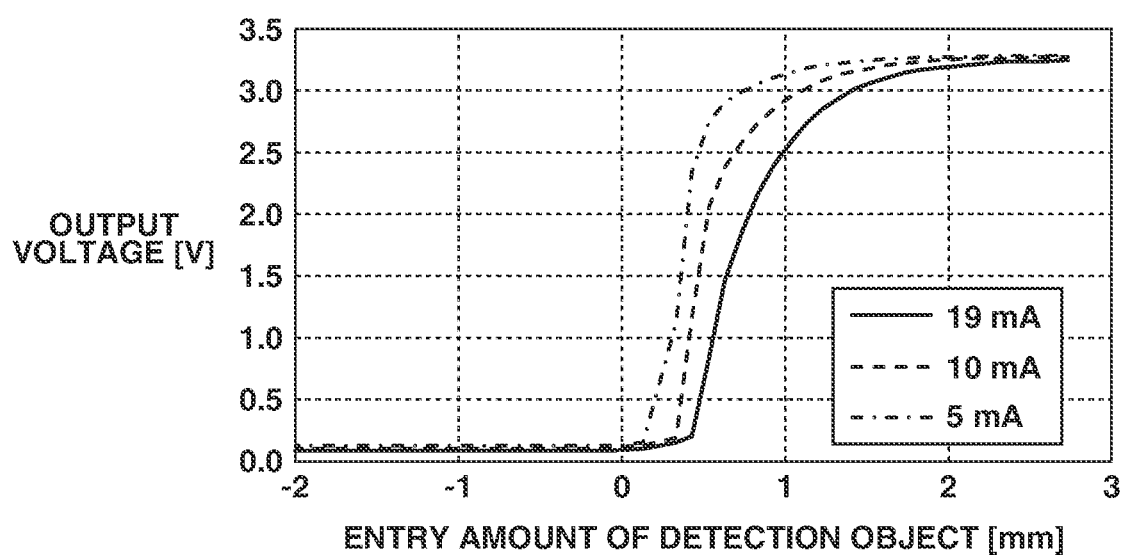
FIG. 6B is a graph illustrating responsiveness in the case where the flag according to the first exemplary embodiment enters the printed circuit board from the side surface side of the printed circuit board.

FIG. 6B is a graph illustrating a relationship between the entry amount of the flag 102 and the voltage output from the voltage output unit 110 of the optical sensor 100. The entry amount of the flag 102 indicates how much the flag 102 enters the printed circuit board 105 in the Y-direction based on the coordinate 0 illustrated in FIG. 6A. As described with reference to the circuit diagram in FIG. 3, if the flag 102 blocks the light traveling from the light-emitting unit 101 to the light-receiving unit 104, the amount of light received by the light-receiving unit 104 decreases, and the current between the collector and the emitter decreases. As a result, the voltage output from the voltage output unit 110 increases. In FIG. 6B, a solid line indicates the responsiveness in a case where the amount of current of the LED chip 111 is 19 mA, a dashed line indicates the responsiveness in a case where the amount of current of the LED chip 111 is 10 mA, and a one-dot chain line indicates the responsiveness in a case where the amount of current of the LED chip 111 is 5 mA. FIG. 6B indicates variation in the responsiveness depending on the amount of light of the LED.

In FIG. 6B, as the flag 102 enters the printed circuit board 105, the output voltage rises relatively rapidly to about 2.0 V. This is because the amount of light received by the light-receiving unit 104 decreases rapidly due to the flag 102 blocking the optical path 106. However, then, the rise in the output voltage relative to the entry amount of the flag 102 is slow.

This is because it takes a predetermined time to cause the flag 102 to enter the printed circuit board 105 from the position thereof in FIG. 7A to the position thereof in FIG. 7C and completely block the stray light 107a, the stray light 107b, and the stray light 107c. More specifically, in the configuration of FIG. 6A in which the flag 102 is caused to enter the printed circuit board 105 from the side surface side of the printed circuit board 105, the rise in the output voltage is slow due to the horizontal width (the width in the Y-direction) of each of the stray light 107a and the influence of the stray light 107b, and the stray light 107c.

Further, the light emitted from the light-emitting unit 101 has directionality. The side view type light-emitting unit 101 often has a horizontally long shape (a shape elongated in the longitudinal direction) as illustrated in FIG. 2A. In such a shape, the light emitted from the light-emitting unit 101 has the property of spreading more widely in the longitudinal direction than in the transverse direction. In the LED chip 111 employed in the present experiment, when the amount of light emission on the optical axis of the LED chip 111 was 100 percent, the amount of light emission at a position inclined by 30 degrees in the transverse direction from the optical axis was about 60%. On the other hand, the amount of light emission at a position inclined by 30 degrees in the longitudinal direction from the optical axis was about 70%. The greater the percentage is, the more widely the light is emitted from the light-emitting unit 101. Thus, it can be said that the amount of stray light is also great, and the directionality is low. In other words, in the present configuration, the amount of stray light is greater in the longitudinal direction of the light-emitting unit 101 than in the transverse direction thereof.

With reference to FIGS. 7A to 7C and based on the descriptions above, since the amount of stray light is great in the longitudinal direction of the light-emitting unit 101, i.e., the Y-direction, in the present configuration, it can be said that the influence of the stray light 107a, the stray light 107b, and the stray light 107c remains strong even in the state where the flag 102 is caused to enter the printed circuit board 105 to the position in FIG. 7A. Thus, to sufficiently raise the output voltage of the voltage output unit 110, it is necessary to cause the flag 102 to enter the printed circuit board 105 to the position thereof in FIG. 7C, and it takes a long time to block all the stray light 107a, the stray light 107b, and the stray light 107c. In other words, in the case where the flag 102 enters the printed circuit board 105 from the side surface side of the printed circuit board 105, the responsiveness of the sensor unit 200 is low.

(Case where Flag is Caused to Enter Printed Circuit Board from Mounting Surface Side of Printed Circuit Board and Case where Flag is Caused to Enter Printed Circuit Board from Opposite Surface Side of Mounting Surface)

Figure 8A:
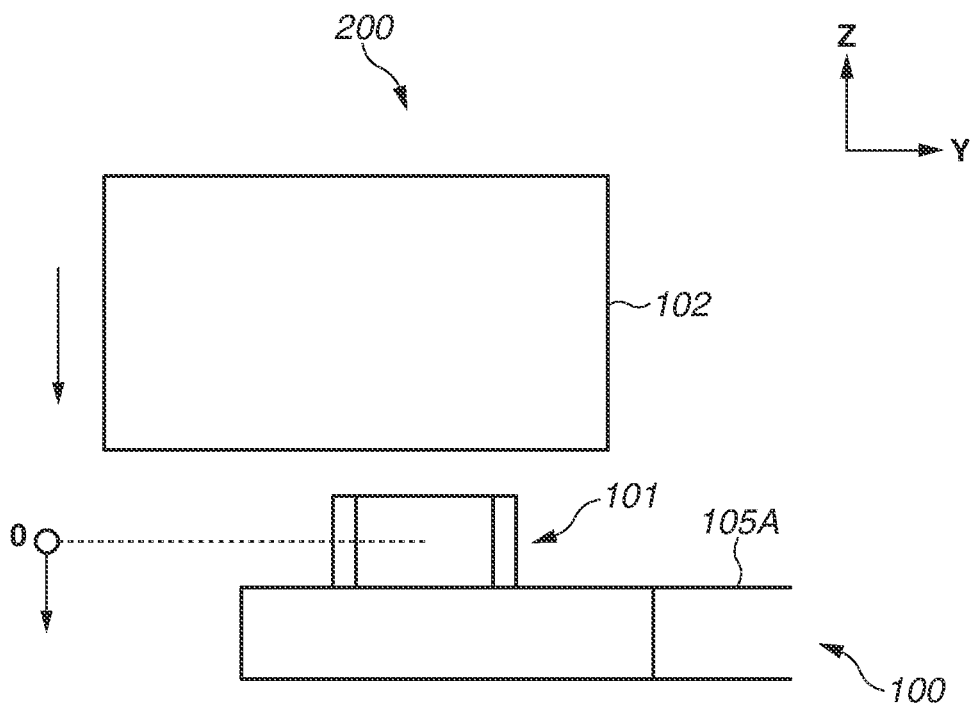
FIG. 8A is a cross-sectional view in a case where the flag according to the first exemplary embodiment enters the printed circuit board from a mounting surface side of the printed circuit board.
Figure 8B:
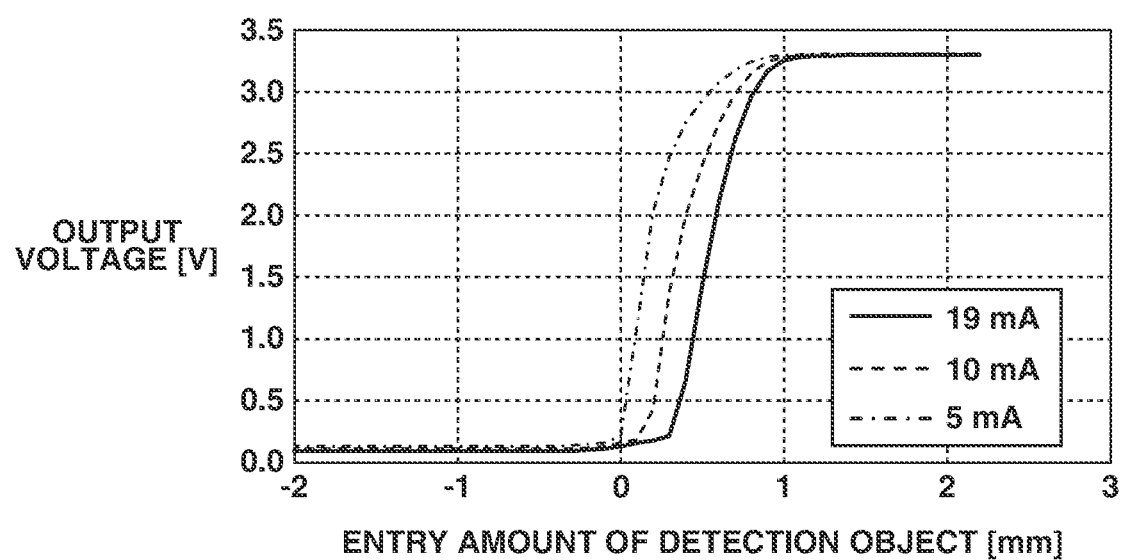
FIG. 8B is a graph illustrating responsiveness in the case where the flag according to the first exemplary embodiment enters the printed circuit board from the mounting surface side of the printed circuit board.
Figure 9A:
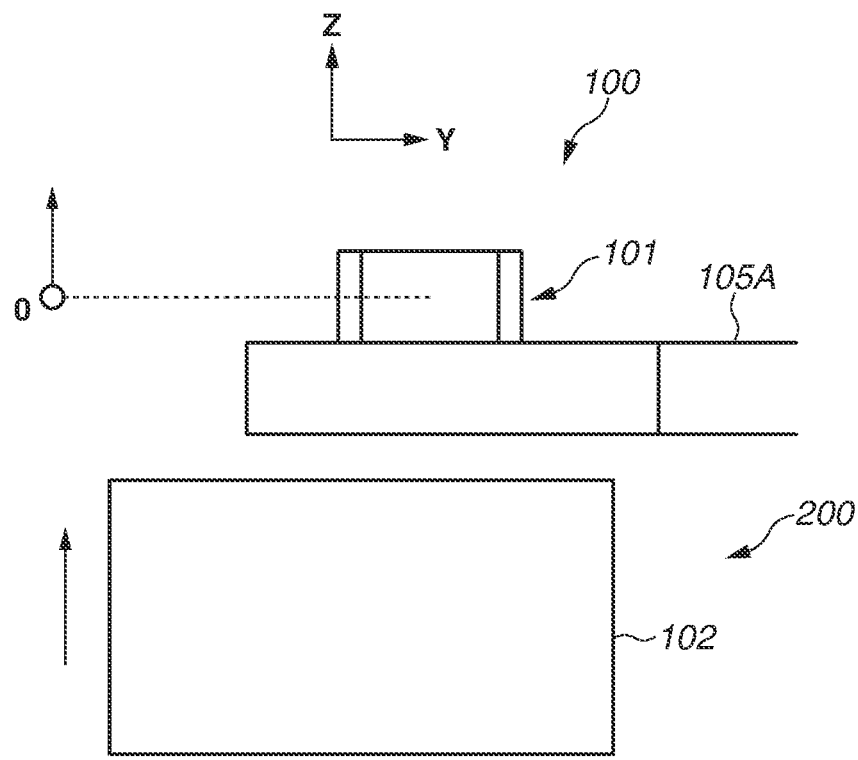
FIG. 9A is a cross-sectional view in a case where the flag according to the first exemplary embodiment enters the printed circuit board from the opposite side of the mounting surface of the printed circuit board.
Figure 9B:
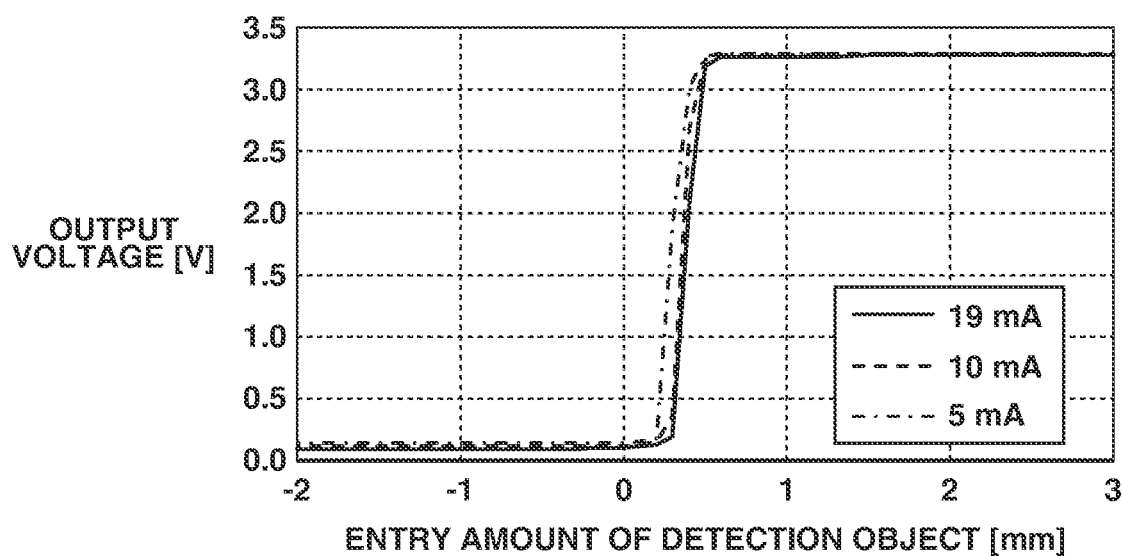
FIG. 9B is a graph illustrating responsiveness in the case where the flag according to the first exemplary embodiment enters the printed circuit board from the opposite side of the mounting surface of the printed circuit board.

Next, with reference to FIGS. 8A and 8B, a case is described where the flag 102 is caused to enter the printed circuit board 105 from the mounting surface 105A side of the printed circuit board 105. With reference to FIGS. 9A and 9B, a case is described where the flag 102 is caused to enter the printed circuit board 105 from the opposite side of the mounting surface 105A.

<Case where Flag is Caused to Enter Printed Circuit Board from Mounting Surface Side>

First, a case is described where the flag 102 is caused to enter the printed circuit board 105 from the mounting surface 105A side of the printed circuit board 105 as illustrated in FIG. 8A.

FIG. 8A is a cross-sectional view of the sensor unit 200 when viewed along the optical axis of the light emitted from the light-emitting unit 101. FIG. 8A selectively illustrates a part of the sensor unit 200. The flag 102 moves in a direction intersecting the mounting surface 105A of the printed circuit board 105 (a direction from the positive side to the negative side of the Z-direction) and enters the cutout 150 from above to below the mounting surface 105A of the printed circuit board 105. A coordinate 0 in the Z-direction in FIG. 8A corresponds to the center position of the optical axis of the optical path 106 in FIG. 4.

FIG. 8B is a graph illustrating a relationship between the entry amount of the flag 102 and the voltage output from the voltage output unit 110 of the optical sensor 100. The entry amount of a detection object on the horizontal axis represents the entry amount of the front end of the flag 102 entering the cutout 150 toward the negative side of the Z-direction relative to the coordinate 0 in FIG. 8A. The output voltage on the vertical axis represents the voltage value of the voltage output unit 110. In FIG. 8B, a solid line indicates the responsiveness in a case where the amount of current of the LED chip 111 is 19 mA, a dashed line indicates the responsiveness in a case where the amount of current of the LED chip 111 is 10 mA, and a one-dot chain line indicates the responsiveness in a case where the amount of current of the LED chip 111 is 5 mA. FIG. 8B indicates variations in the responsiveness depending on the amount of light of the LED.

Next, with reference to FIGS. 10A to 10E, a description is provided of the state where the flag 102 moves from above to below the mounting surface 105A of the printed circuit board 105. Light passing through the optical path 106 illustrated in FIG. 4 and incident on the light-receiving unit 104 is α, and stray light passing through the inside of the printed circuit board 105 and incident on the light-receiving unit 104, such as the stray light 107a and 107b, is β. The amount of light of the light α is greater than that of the stray light β. If the amount of light emission of the light-emitting element changes, the amount of light of each of the light α and the stray light β also proportionally changes.

Figure 10A:
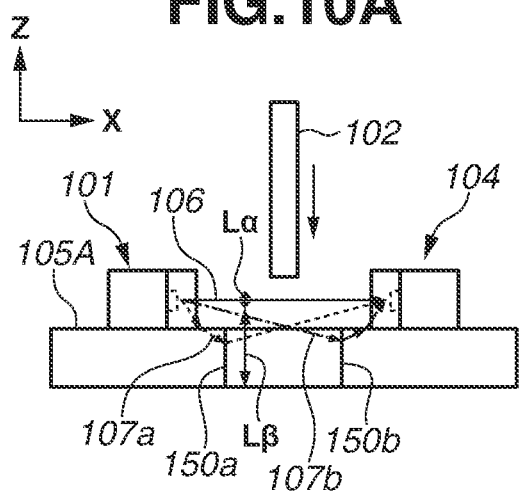
FIGS. 10A, 10B, 10C, 10D, and 10E are cross-sectional views in the case where the flag according to the first exemplary embodiment enters the printed circuit board from the mounting surface side of the printed circuit board.
Figure 10B:
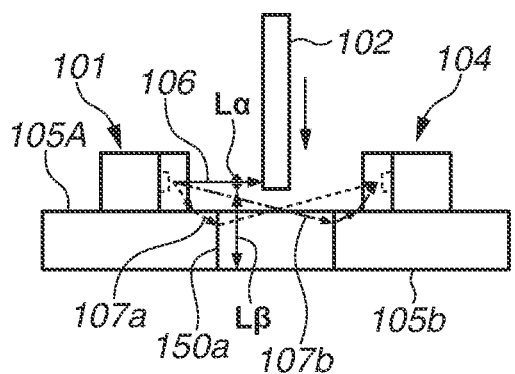
Figure 10C:
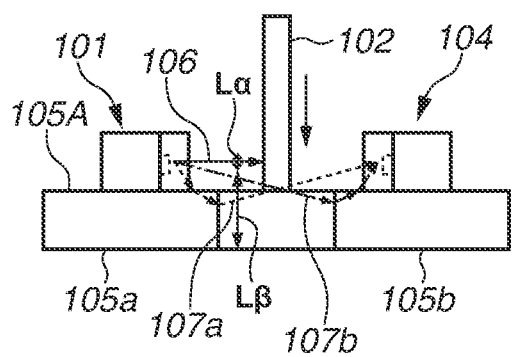
Figure 10D:
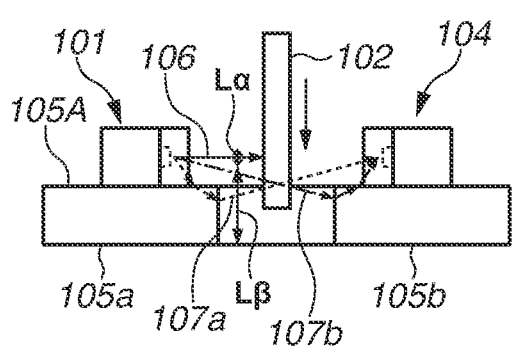
Figure 10E:
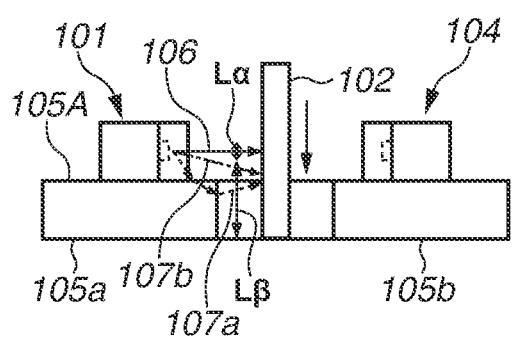

In FIGS. 10A to 10E, the width of the light α in the moving direction of the flag 102 is Lα, and the width of the light β in the moving direction of the flag 102 is Lβ. FIG. 10A illustrates a state where the flag 102 blocks neither the light α nor the stray light β. FIG. 10B illustrates a state where the flag 102 is caused to enter the cutout 150 and blocks only the entirety of the light α. FIG. 10C illustrates a state where the flag 102 blocks the entirety of the light α and a part of the stray light β. FIG. 10D illustrates a state where the flag 102 further blocks a part of the stray light β. FIG. 10E illustrates a state where the flag 102 blocks the entirety of the light α and the stray light β.

Figure 11:
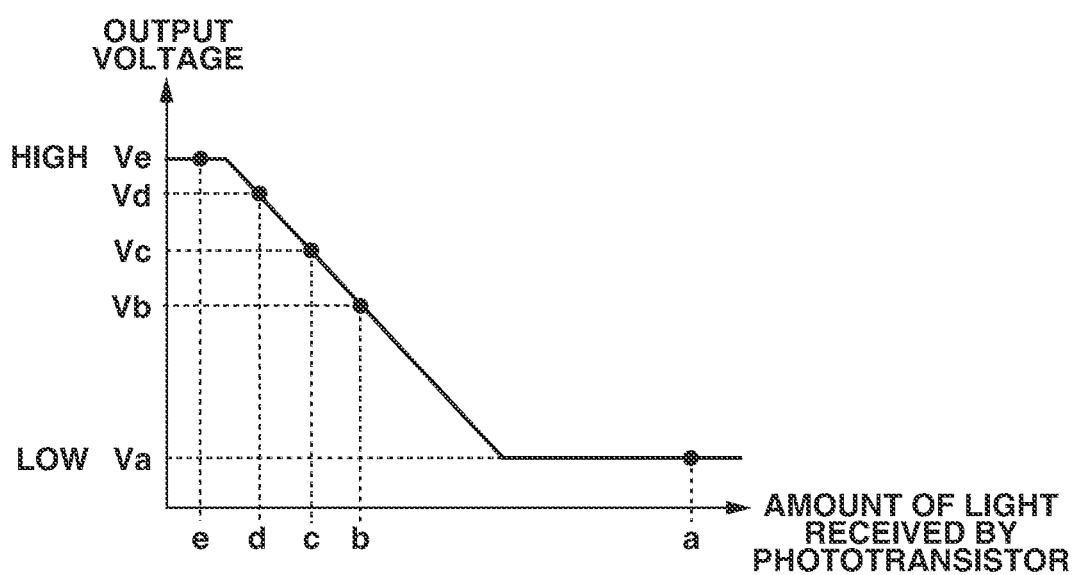
FIG. 11 is a graph illustrating a relationship between an amount of light received by a phototransistor and an output voltage of a voltage output unit in the case where the flag according to the first exemplary embodiment enters the printed circuit board from the mounting surface side of the printed circuit board.

With reference to FIG. 11, a relationship between the amount of light received by the phototransistor chip 114 and the voltage value (the output voltage) of the voltage output unit 110 is described. The amount of received light in FIG. 11 decreases as the flag 102 enters the cutout 150 and blocks light entering the phototransistor chip 114.

In FIG. 11, when the flag 102 is at the position thereof in FIG. 10A, the amount of received light is a, and the output voltage is Va. When the flag 102 is at the position thereof in FIG. 10B, the amount of received light is b, and the output voltage is Vb. When the flag 102 is at the position thereof in FIG. 10C, the amount of received light is c, and the output voltage is Vc. When the flag 102 is at the position thereof in FIG. 10D, the amount of received light is d, and the output voltage is Vd. When the flag 102 is at the position thereof in FIG. 10E, the amount of received light is e, and the output voltage is Ve. In FIG. 11, a to e indicate the amount of light received by the phototransistor chip 114, and the relationships a>b>c>d>e hold true.

As illustrated in FIGS. 10A to 10E, in a case where the flag 102 is caused to enter the printed circuit board 105 from the mounting surface 105A side, the flag 102 blocks the light α before the stray light β. If the flag 102 blocks the light α, which is strong light, the amount of received light significantly decreases, and the amount of current between the collector and the emitter also decreases. Due to characteristics of the phototransistor, if the flowing current decreases, the output voltage of the voltage output unit 110 (FIG. 3) increases. If the flag 102 is moved from the position illustrated in FIG. 10A to the position illustrated in FIG. 10B, then as illustrated in FIG. 11, the output voltage increases rapidly from Va to Vb, but does not reach a high output.

Next, the flag 102 is caused to enter the printed circuit board 105 from the position thereof in FIG. 10B to the position thereof in FIG. 10D and also blocks the stray light β. The amount of change in the amount of received light when the flag 102 blocks the stray light β, which is weak light, is small, and therefore, the speed of decrease in the current between the collector and the emitter is slow. Thus, in FIG. 11, the output voltage increases slowly from Vb to Ve and eventually reaches a high output.

Based on the above, as illustrated in FIG. 8B, in this configuration, the voltage output from the voltage output unit 110 depending on the entry amount of the flag 102 to the cutout 150 rises relatively slowly.

<Case where Flag is Caused to Enter Printed Circuit Board from Opposite Side of Mounting Surface>

Next, a case is described where the flag 102 is caused to enter the printed circuit board 105 from the opposite side of the mounting surface 105A of the printed circuit board 105 as illustrated in FIG. 9A.

FIG. 9A is a cross-sectional view of the sensor unit 200 when viewed along the optical axis of the light emitted from the light-emitting unit 101. FIG. 9A selectively illustrates a part of the sensor unit 200. The flag 102 moves in a direction intersecting the mounting surface 105A of the printed circuit board 105 (a direction from the negative side to the positive side of the Z-direction) and enters the cutout 150 from below to above the mounting surface 105A of the printed circuit board 105. A coordinate 0 in the Z-direction in FIG. 9A corresponds to the center position of the optical axis of the optical path 106 in FIG. 4.

FIG. 9B is a graph illustrating a relationship between the entry amount of the flag 102 and the voltage output from the voltage output unit 110 of the optical sensor 100. The entry amount of a detection object on the horizontal axis represents the entry amount of the front end of the flag 102 entering the cutout 150 toward the positive side of the Z-direction relative to the coordinate 0 in FIG. 9A. The output voltage on the vertical axis represents the voltage value of the voltage output unit 110. In FIG. 9B, a solid line indicates the responsiveness in a case where the amount of current of the LED chip 111 is 19 mA, a dashed line indicates the responsiveness in a case where the amount of current of the LED chip 111 is 10 mA, and a one-dot chain line indicates the responsiveness in a case where the amount of current of the LED chip 111 is 5 mA. FIG. 9B indicates variation in the responsiveness depending on to the amount of light of the LED.

Next, with reference to FIGS. 12A to 12E, a description is provided of the state where the flag 102 moves from below to above the mounting surface 105A of the printed circuit board 105. Light passing through the optical path 106 illustrated in FIG. 4 and incident on the light-receiving unit 104 is α, and stray light passing through the inside of the printed circuit board 105 and incident on the light-receiving unit 104, such as the stray light 107a and 107b, is β. The amount of light of the light α is greater than that of the stray light β. If the amount of light emission of the light-emitting element changes, the amount of light of each of the light α and the stray light β also proportionally changes.

Figure 12A:
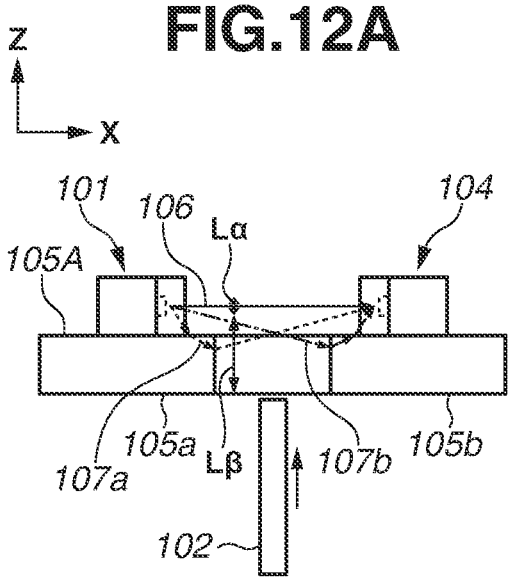
FIGS. 12A, 12B, 12C, 12D, and 12E are cross-sectional views in the case where the flag according to the first exemplary embodiment enters the printed circuit board from the opposite side of the mounting surface of the printed circuit board.
Figure 12B:
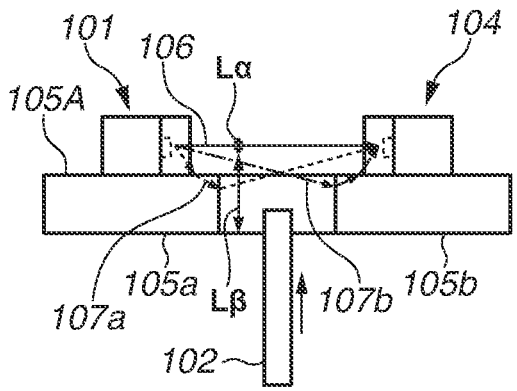
Figure 12C:
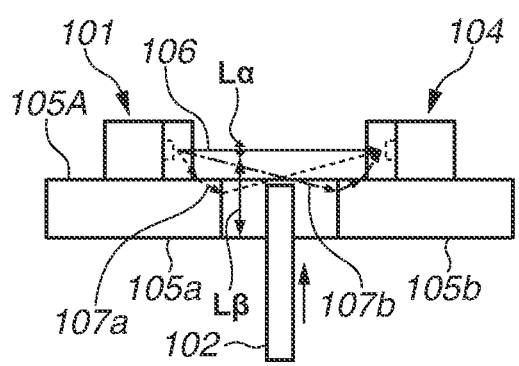
Figure 12D:
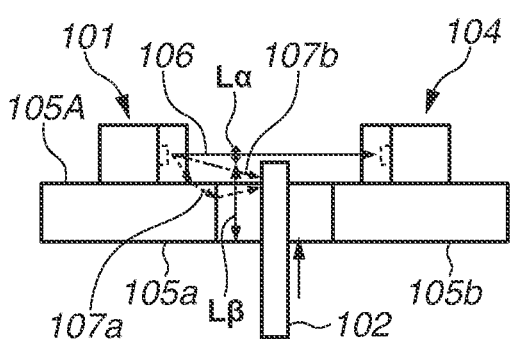
Figure 12E:
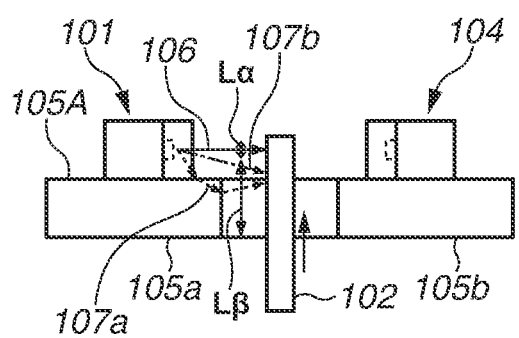

In FIGS. 12A to 12E, the width of the light α in the moving direction of the flag 102 is Lα, and the width of the light β in the moving direction of the flag 102 is Lβ. FIG. 12A illustrates a state where the flag 102 blocks neither the light α nor the stray light β. FIG. 12B illustrates a state where the flag 102 is caused to enter the cutout 150 and blocks a part of the stray light β. FIG. 12C illustrates a state where the flag 102 blocks a part of the stray light β more than in FIG. 12B. FIG. 12D illustrates a state where the flag 102 blocks the entirety of the stray light β and receives only the light α. FIG. 12E illustrates a state where the flag 102 blocks the entirety of the light α and the stray light β.

Figure 13:
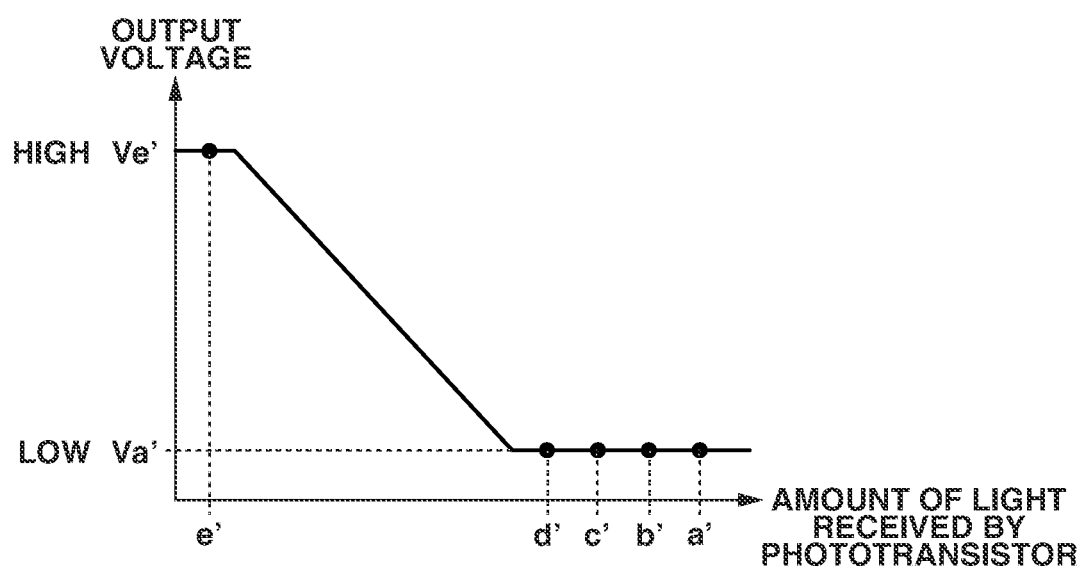
FIG. 13 is a graph illustrating the relationship between the amount of light received by the phototransistor and the output voltage of the voltage output unit in the case where the flag according to the first exemplary embodiment enters the printed circuit board from the opposite side of the mounting surface of the printed circuit board.

With reference to FIG. 13, a relationship between the amount of light received by the phototransistor chip 114 and the voltage value (the output voltage) of the voltage output unit 110 is described. The amount of received light in FIG. 13 decreases as the flag 102 enters the cutout 150 and blocks light entering the phototransistor chip 114.

In FIG. 13, when the flag 102 is at the position thereof in FIG. 12A, the amount of received light is a', and the output voltage is Va'. When the flag 102 is at the position thereof in FIG. 12B, the amount of received light is b', and the output voltage is Vb' (not illustrated). When the flag 102 is at the position thereof in FIG. 12C, the amount of received light is c', and the output voltage is Vc' (not illustrated). When the flag 102 is at the position thereof in FIG. 12D, the amount of received light is d', and the output voltage is Vd' (not illustrated). When the flag 102 is at the position thereof in FIG. 12E, the amount of received light is e', and the output voltage is Ve'. In FIG. 13, a' to e' indicate the amount of light received by the phototransistor chip 114, and the relationships a'>b'>c'>d'>e' hold true.

As illustrated in FIGS. 12A to 12E, in a case where the flag 102 is caused to enter the printed circuit board 105 from the opposite side of the mounting surface 105A, the flag 102 blocks the stray light β before the light α. Even if the flag 102 is moved from the position thereof in FIG. 12A to the position thereof in FIG. 12D and blocks the stray light β, which is weak light, the light α, which is strong light, is sufficiently received, and therefore, the amount of received light does not greatly change. Thus, the amount of current between the collector and the emitter does not change, either, and the output voltage does not change from Va' to Vd', either.

Next, if the flag 102 is caused to enter the printed circuit board 105 from the position thereof in FIG. 12D to the position thereof in FIG. 12E and blocks the light α, the amount of received light decreases rapidly, and the amount of current between the collector and the emitter also decreases rapidly. Due to the decrease in the current, the output voltage increases rapidly from Va' to Ve' and reaches a high output.

Based on the above, as illustrated in FIG. 9B, in this configuration, the voltage output from the voltage output unit 110 depending on the entry amount of the flag 102 to the cutout 150 rises steeply.

To sum up, as is clear from the comparison between the graphs in FIGS. 8B and 9B, the responsiveness of the sensor unit 200 is more excellent in the case where the flag 102 is caused to enter the printed circuit board 105 from the opposite side of the mounting surface 105A than in the case where the flag 102 is caused to enter the printed circuit board 105 from the mounting surface 105A side.

With regard to the LED chip 111, the amount of light emission thereof may decrease due to aging, or an individual difference may occur in the amount of light emission. The amount of light emission of the LED chip 111 is proportional to the amount of current of the LED, and therefore, in FIGS. 8B and 9B, the influence of the change in the amount of light emission of the LED chip 111 is represented in a simulated manner by changing the current of the LED chip 111.

As illustrated in FIG. 8B, in the case where the flag 102 is caused to enter the printed circuit board 105 from the mounting surface 105A side, the timing of the rise in the output voltage differs. More specifically, due to variations in the amount of light emission caused by aging or an individual difference in the LED chip 111, variations are likely to occur in the timing when the output of the voltage output unit 110 responds to the flag 102. On the other hand, as illustrated in FIG. 9B, in the case where the flag 102 is caused to enter the printed circuit board 105 from the opposite surface side of the mounting surface 105A of the printed circuit board 105, the rise in the output voltage differs little due to the difference in the current of the LED chip 111. From this, it can be said that this configuration is less likely to be influenced by aging or an individual difference in the LED chip 111.

For the above reason, in terms of the responsiveness of the sensor unit 200, it is desirable to cause the flag 102 to enter the printed circuit board 105 from the opposite side of the mounting surface 105A of the light-emitting unit 101 and the light-receiving unit 104.

In the present exemplary embodiment, a description has been provided of the sensor unit 200 in which the light-emitting unit 101 and the light-receiving unit 104 are placed facing each other, and further, the flag 102 is caused to enter the printed circuit board 105 by passing through the cutout 150 provided between the light-emitting unit 101 and the light-receiving unit 104 on the printed circuit board 105. The sensor unit 200 does not require a light guide having a reflective surface or a housing, and therefore can have an inexpensive and simple configuration.

Further, in the present exemplary embodiment, a description has been provided of an improvement in the responsiveness of the sensor unit 200 by elaborating the entry direction of the flag 102. Descriptions have been provided above of the configuration in which the flag 102 is caused to enter the printed circuit board 105 from the side surface side of the printed circuit board 105 (FIG. 6A), the configuration in which the flag 102 is caused to enter the printed circuit board 105 from the mounting surface 105A side (FIG. 8A), and the configuration in which the flag 102 is caused to enter the printed circuit board 105 from the opposite side of the mounting surface 105A (FIG. 9A).

Then, it has been stated that, in the configuration in which the flag 102 is caused to enter the printed circuit board 105 from the opposite side of the mounting surface 105A of the printed circuit board 105, it is possible to improve the responsiveness of the sensor unit 200 the most. It has been found that, also in the configuration in which the flag 102 is caused to enter the printed circuit board 105 from the mounting surface 105A side of the printed circuit board 105, it is possible to improve the responsiveness of the sensor unit 200 compared to the configuration in which the flag 102 is caused to enter the printed circuit board 105 from the side surface side. This is because the width (Lβ) of the stray light 107a or 107b in the Z-direction illustrated in FIGS. 10A to 10E and 12A to 12E is shorter than the width of each of the stray light 107a and the stray light 107b in the Y-direction illustrated in FIG. 5. In other words, in the configuration in which the flag 102 is caused to enter the printed circuit board 105 from the mounting surface 105A side of the printed circuit board 105, it is possible to block the stray light 107a and the stray light 107b with a smaller amount of movement of the flag 102 than in the configuration in which the flag 102 is caused to enter the printed circuit board 105 from the side surface side.

In summary, to improve the responsiveness of the sensor unit 200, it is desirable to configure the flag 102 to move in a direction intersecting the mounting surface 105A of the printed circuit board 105.

<Case of Hole, Not Cutout>

Figure 14:
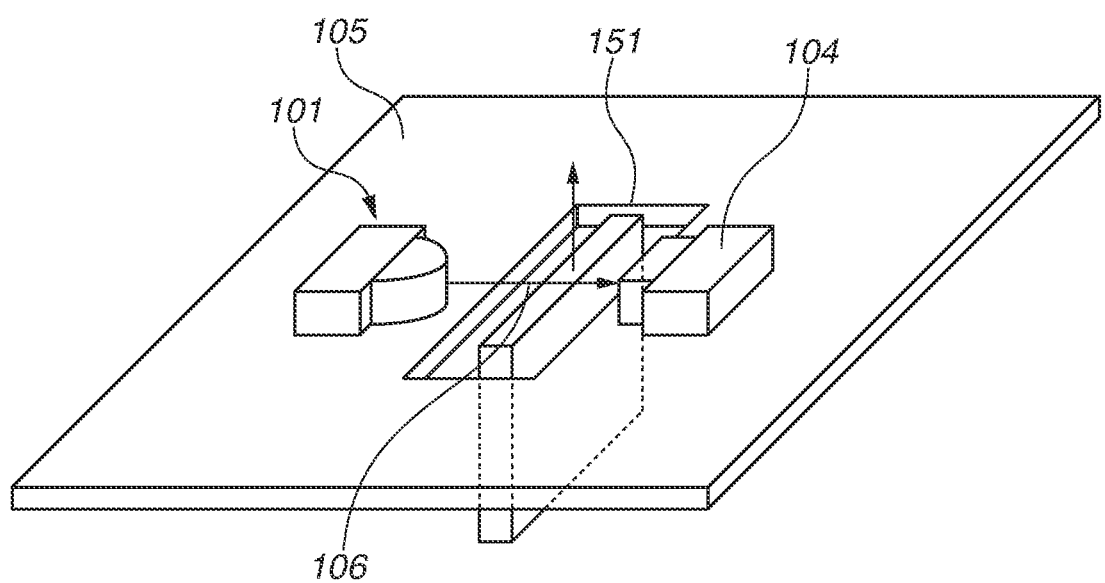
FIG. 14 is a perspective view of a sensor unit according to a second exemplary embodiment.

With reference to FIG. 14, a sensor unit 200 according to a second exemplary embodiment of the present disclosure is described. In the second exemplary embodiment, components similar to those in the first exemplary embodiment are not described. FIG. 14 is a perspective view of the sensor unit 200 according to the second exemplary embodiment.

In the second exemplary embodiment, a hole 151 is provided between the light-emitting unit 101 and the light-receiving unit 104 on the printed circuit board 105. The flag 102 enters the printed circuit board 105 by passing through the hole 151 of the printed circuit board 105 and blocks the optical path 106 through which light emitted parallel to the mounting surface 105A of the printed circuit board 105 from the light-emitting unit 101 reaches the light-receiving unit 104. Consequently, the amount of light received by the light-receiving unit 104 changes, and the flag 102 is detected. While a rectangle is exemplified as the shape of the hole 151 of the printed circuit board 105, the shape of the hole 151 is not limited thereto.

As described above, the hole 151 is provided between the light-emitting unit 101 and the light-receiving unit 104 on the printed circuit board 105 and serves as an entry path for the flag 102, whereby it is possible to place the optical sensor 100 at any position on the printed circuit board 105 without the position of the optical sensor 100 being limited to an edge portion of the printed circuit board 105.

<Description of Measures Against Stray Light on Printed Circuit Board>

Next, an example is described where the surface of the printed circuit board 105 is processed using a pattern or silk to reduce the stray light 107a and the stray light 107b propagating inside the printed circuit board 105 and improve the responsiveness of the flag 102.

Figure 15A:
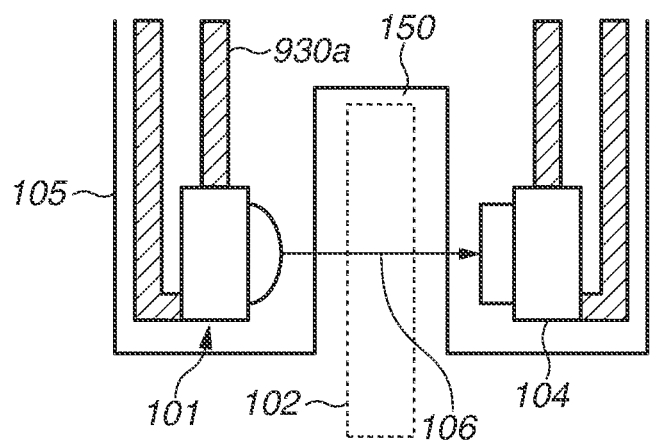
FIGS. 15A, 15B, and 15C are top views in a case where measures against stray light are taken on a surface of a printed circuit board.
Figure 15B:
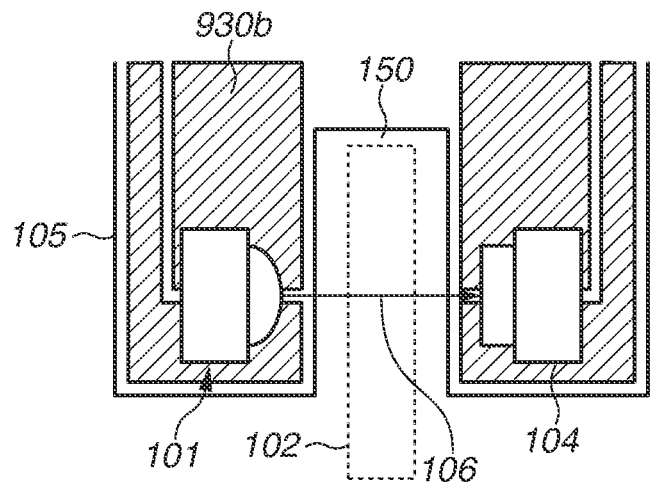
Figure 15C:
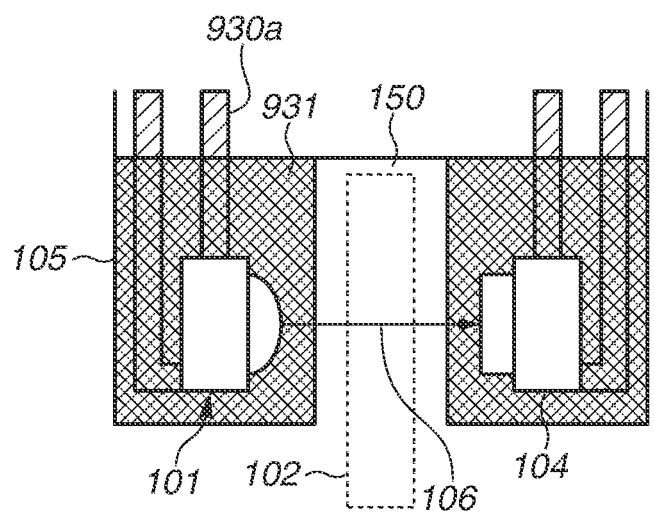

FIGS. 15A to 15C illustrate examples of measures against stray light using a pattern or silk. FIG. 15A illustrates the printed circuit board 105 and a pattern before the measures are taken, and a pattern 930a has a width of 0.2 mm.

FIG. 15B illustrates measures against stray light using a pattern. The periphery of the light-emitting unit 101 and the periphery of the light-receiving unit 104 are each covered with a solid pattern 930b, thereby stray light entering inside the printed circuit board 105 from the surface of the printed circuit board 105 is reflected, and the stray light propagating inside the printed circuit board 105 is reduced.

FIG. 15C illustrates measures using a silk 931. The periphery of the light-emitting unit 101 and the light-receiving unit 104 is covered with the black silk 931, thereby stray light entering inside the printed circuit board 105 from the surface of the printed circuit board 105 is absorbed, and stray light propagating inside the printed circuit board 105 is reduced. The color of the silk may be other than black. In this case, a silk layer is provided on the surface of the printed circuit board 105, thereby providing the effect of reducing light entering inside the printed circuit board 105 from the surface of the printed circuit board 105.

The measures against stray light using the solid pattern and the silk reduce stray light entering inside the printed circuit board 105, thereby particularly improving the responsiveness in the case where the flag 102 is caused to enter the printed circuit board 105 from the mounting surface 105A side of the printed circuit board 105.

Further, the effects of the measures against stray light using the solid pattern and the silk do not contradict each other, and the measures may be taken together on the surface of the printed circuit board 105. The measures against stray light using the solid pattern and the silk do not need to be taken on the entirety of the surface of the printed circuit board 105, and may be taken on only at least a portion where the light-emitting unit 101 is mounted or the periphery of the portion.

<Description of Case of Use in Detection of Opening and Closing of Door>

Figure 16:
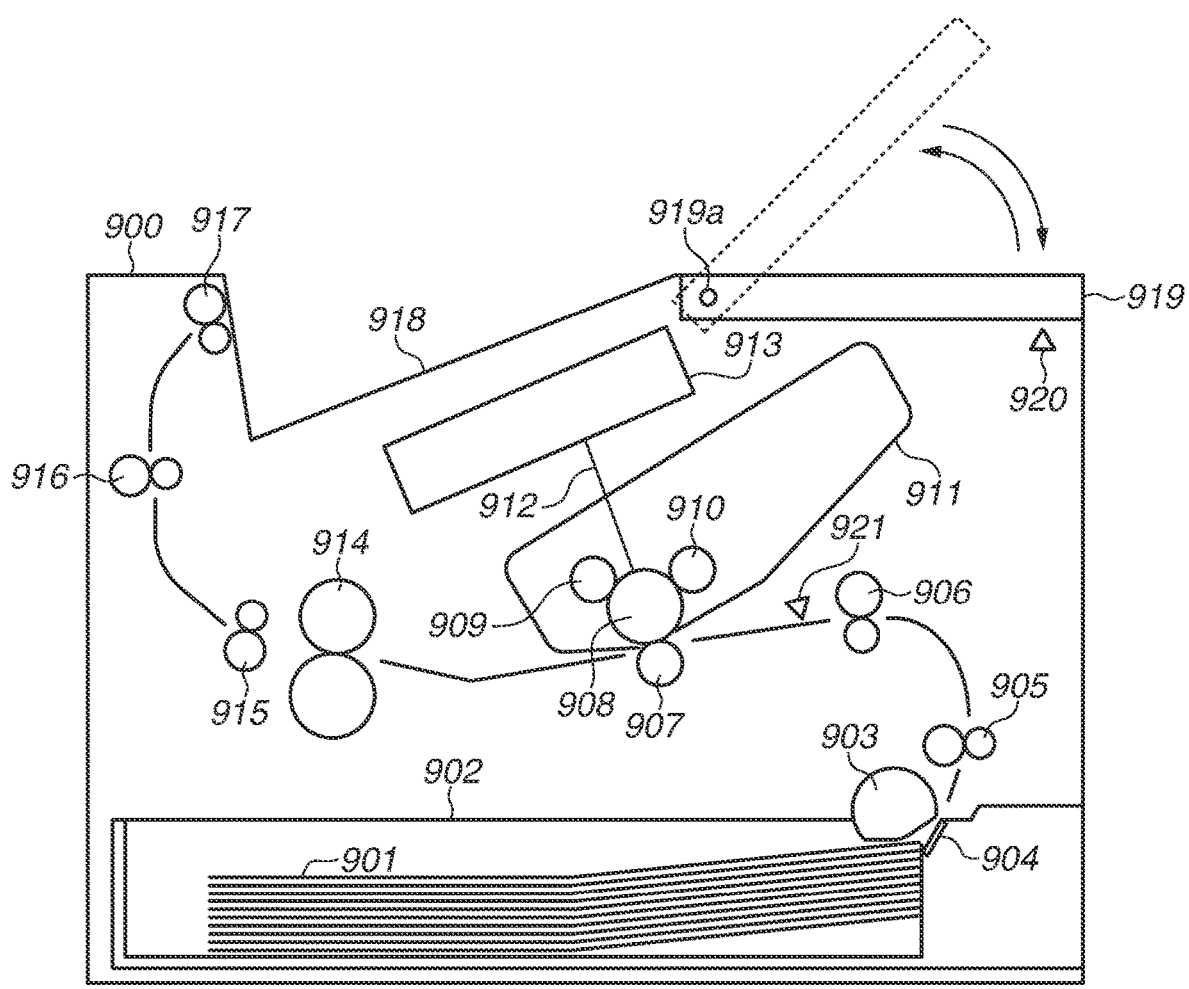
FIG. 16 is a cross-sectional view of an image forming apparatus using the sensor unit according to each of the first and second exemplary embodiments.

Next, with reference to FIG. 16, an image forming apparatus using the sensor unit 200 is described.

(General Configuration of Image Forming Apparatus)

FIG. 16 is a diagram illustrating a general configuration of an image forming apparatus 900 according to the present exemplary embodiment. With reference to FIG. 16, a description is provided of an overview of the process of forming an image on a recording material that is performed by the image forming apparatus 900. A photosensitive member 908 is an image bearing member provided in a process cartridge 911 and driven by a motor (not illustrated). An electrostatic latent image is formed on the surface of the image bearing member, the electrostatic latent image is developed using toner, and the image bearing member bears the developed toner image. A charging roller 909 as a charging member is a member that uniformly charges the surface of the photosensitive member 908. To the charging roller 909, a high voltage (also referred to as a charging bias) is supplied from a power supply circuit (not illustrated) that generates a high voltage. A laser scanner unit 913 is an exposure unit for exposing the surface of the photosensitive member 908 uniformly charged by the charging roller 909, thereby forming an electrostatic latent image. The laser scanner unit 913 includes a semiconductor laser (not illustrated) for emitting a laser beam. The laser scanner unit 913 emits a laser beam 912 based on image data to the photosensitive member 908, thereby forming the electrostatic latent image. A developing roller 910 is a developing member that supplies toner to the electrostatic latent image formed on the surface of the photosensitive member 908, thereby developing the latent image and forming a toner image. To the developing roller 910, a high voltage (also referred to as a developing bias) is supplied from the power supply circuit (not illustrated) that generates a high voltage.

In a sheet feeding cassette 902, sheets 901 as recording materials are stacked. As the sheets 901, various types of sheet such as plain paper, thin paper, thick paper, overhead transparency (OHT) sheets, and rough paper can be used. The sheets 901 are fed by a sheet feeding roller 903 and sorted by a frictional force of a separation pad 904, and only one of the sheets 901 is fed to a conveying roller pair 905. Then, the sheet 901 passes through the conveying roller pair 905 and a registration roller pair 906 and is conveyed to a transfer position where the photosensitive member 908 and a transfer roller 907 abut each other. To the transfer roller 907, a high voltage (also referred to as a transfer bias) is supplied from the power supply circuit (not illustrated) that generates a high voltage. The transfer roller 907 transfers the toner image on the photosensitive member 908 to the sheet 901. A fixing roller pair 914 applies heat and pressure to the toner image, thereby melting the toner image and firmly fixing the toner image on the sheet 901. The sheet 901 conveyed by the fixing roller pair 914 passes through discharge roller pairs 915, 916, and 917 and is discharged to and stacked in a discharge tray 918.

(Description of Front Door)

A door 919 that also serves as an exterior cover of the image forming apparatus 900 is openable and closable about a pivot point 919a. In a state where the door 919 is open, some of process members inside the image forming apparatus 900 are exposed. The door 919 is opened and closed by an operation of an operator or a user to, for example, attach or detach the process cartridge 911, which is replaceable as a unit including a photosensitive drum as an image bearing member, clear the jam of the sheet 901, or maintain the apparatus. A door sensor 920 is a sensor that detects the opening/closing state of the door 919. The door sensor 920 transmits, to the CPU 801 as a control unit, a door signal of which a signal level switches to high and low by the operation of opening and closing the door 919.

As the door sensor 920, the sensor unit 200 described in each of the first and second exemplary embodiments can be used. A configuration may be employed in which the flag 102 is provided in the door 919 and moves together with the door 919. Alternatively, a configuration may be employed in which the flag 102 is separate from the door 919, is provided in an apparatus main body of the image forming apparatus 900, and when the door 919 is closed relative to the apparatus main body, is moved by receiving a force from the door 919.

<Description of Case of Use in Detection of Front End of Sheet>
(Description of Top Sensor)

A top sensor 921 is a sensor that detects the presence or absence of the sheet 901 at a predetermined position in the conveying path of the sheet 901. For example, the top sensor 921 transmits, to the CPU 801 as the control unit, a top signal of which a signal level switches to high and low depending on a light-receiving state of the light-receiving unit 104 changing by the leading edge of the sheet 901 coming into contact with the flag 102 and the flag 102 entering the cutout 150 or the hole 151. The top signal is a synchronization signal in the conveyance of the sheet 901 and is used to synchronize the leading edge of a toner image formed on the photosensitive member 908 and the leading edge of the sheet 901 and transfer the image to a predetermined position on the sheet 901.

As the top sensor 921, the sensor unit 200 described in each of the first and second exemplary embodiments can be used.

The image forming apparatus 900 may be an image forming apparatus that includes a plurality of photosensitive drums and an intermediate transfer member, instead of the components illustrated in FIG. 16, and forms a color image.

According to the present disclosure, it is possible to provide a sensor unit excellent in responsiveness.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2022-094839, which was filed on Jun. 13, 2022 and which is hereby incorporated by reference herein in its entirety.

What is claimed is:

1. An image forming apparatus comprising:
   an image forming unit configured to form an image on a recording material;
   a door openable and closable relative to an apparatus main body of the image forming apparatus;
   a control unit configured to detect an opening/closing state of the door; and
   a sensor unit,
   wherein the sensor unit includes:
   a light-emitting unit including a light-emitting element configured to emit light;
   a light-receiving unit including a light-receiving element configured to receive the light emitted from the light-emitting element;
   a flag configured to pass through a space between the light-emitting unit and the light-receiving unit; and
   a printed circuit board having a mounting surface on which the light-emitting unit and the light-receiving unit are mounted,
   wherein a cutout or a hole is formed in the printed circuit board,
   wherein the light-emitting unit and the light-receiving unit are mounted on the mounting surface of the printed circuit board so that the light-emitting element and the light-receiving element face each other, and the light emitted from the light-emitting element travels straight along the mounting surface of the printed circuit board over the cutout or the hole,
   wherein the flag is configured to move in a direction intersecting the mounting surface of the printed circuit board and enter the cutout or the hole, thereby blocking the light traveling from the light-emitting element to the light-receiving element, and
   wherein the flag moves by an operation of opening and closing the door, and the light-receiving unit outputs a signal based on a light-receiving state of the light to the control unit, whereby the control unit detects the opening/closing state of the door.

2. The image forming apparatus according to claim 1, wherein the flag is provided in the door and moves together with the door by the operation of opening and closing the door.

3. The image forming apparatus according to claim 1, wherein the flag is separate from the door, is provided in the apparatus main body, and in a case where the door is closed relative to the apparatus main body, moves by receiving a force from the door.

4. The image forming apparatus according to claim 1, wherein the flag is configured to enter the cutout or the hole from a surface of the printed circuit board on an opposite side of the mounting surface of the printed circuit board.

5. The image forming apparatus according to claim 1, wherein the flag is configured to move in a direction perpendicular to the mounting surface of the printed circuit board and enter the cutout or the hole.

6. The image forming apparatus according to claim 1, wherein, on the mounting surface of the printed circuit board, a pattern of a portion where at least the light-emitting element is mounted is a solid pattern.

7. The image forming apparatus according to claim 1, wherein the mounting surface of the printed circuit board includes a silk layer in a portion where at least the light-emitting element is mounted.

8. An image forming apparatus comprising:
   an image forming unit configured to form an image on a recording material;
   a conveying unit configured to convey a recording material;
   a control unit configured to detect the recording material conveyed by the conveying unit; and
   a sensor unit,
   wherein the sensor unit includes:
   a light-emitting unit including a light-emitting element configured to emit light;
   a light-receiving unit including a light-receiving element configured to receive the light emitted from the light-emitting element;
   a flag configured to pass through a space between the light-emitting unit and the light-receiving unit; and
   a printed circuit board having a mounting surface on which the light-emitting unit and the light-receiving unit are mounted,
   wherein a cutout or a hole is formed in the printed circuit board,
   wherein the light-emitting unit and the light-receiving unit are mounted on the mounting surface of the printed circuit board so that the light-emitting element and the light-receiving element face each other, and the light emitted from the light-emitting element travels straight along the mounting surface of the printed circuit board over the cutout or the hole,
   wherein the flag is configured to move in a direction intersecting the mounting surface of the printed circuit board and enter the cutout or the hole, thereby blocking the light traveling from the light-emitting element to the light-receiving element, and wherein the flag moves by a leading edge of the recording material conveyed by the conveying unit coming into contact with the flag, and the light-receiving unit outputs a signal based on a light-receiving state of the light to the control unit, whereby the control unit detects the recording material.

\* \* \* \* \*